US010101178B2

(12) United States Patent
Dias et al.

(10) Patent No.: US 10,101,178 B2
(45) Date of Patent: Oct. 16, 2018

(54) IDENTIFYING A POSITION OF A COMPUTING DEVICE IN A RACK

(71) Applicant: LENOVO ENTERPRISE SOLUTIONS (SINGAPORE) PTE. LTD., Singapore (SG)

(72) Inventors: Israel S. Dias, Sorocaba (BR); Emil P. Parker, Youngsville, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 272 days.

(21) Appl. No.: 14/859,699

(22) Filed: Sep. 21, 2015

(65) Prior Publication Data

US 2017/0082460 A1 Mar. 23, 2017

(51) Int. Cl.
*G01C 9/00* (2006.01)
*G01D 5/16* (2006.01)

(52) U.S. Cl.
CPC .................................. *G01D 5/16* (2013.01)

(58) Field of Classification Search
CPC ........ H01L 2924/0002; H01L 2924/00; H01L 23/4006; H01L 23/433; G06F 17/50; G06F 12/0246; G06F 12/0871; G06F 2212/1036; G06F 2212/2022; G06F 2212/222; G06F 2212/284; G06F 2212/7204; G06F 2212/72
See application file for complete search history.

(56) References Cited

U.S. PATENT DOCUMENTS

| | | | |
|---|---|---|---|
| 9,626,319 B2 * | 4/2017 | Jacobson | G06F 13/385 |
| 2008/0044705 A1 * | 2/2008 | Jang | G01N 9/002 |
| | | | 429/414 |
| 2013/0120922 A1 * | 5/2013 | Castle | G06F 1/1601 |
| | | | 361/679.08 |
| 2013/0127313 A1 * | 5/2013 | Schrader | H05K 7/2019 |
| | | | 312/236 |

* cited by examiner

*Primary Examiner* — Robert Bachner
(74) *Attorney, Agent, or Firm* — Brandon C. Kennedy; Jason A. Friday; Kennedy Lenart Spraggins LLP (57) ABSTRACT

Identifying a position of a computing device in a rack may include measuring resistance of one or more resistors of a rack position indicator, said rack position indicator affixed to a rack in which said computing device is installed and ascertaining, from the measured resistance of the one or more resistors, a position in which the computing device is installed.

16 Claims, 7 Drawing Sheets

IDENTIFYING A POSITION OF A COMPUTING DEVICE IN A RACK

BACKGROUND OF THE INVENTION

Field of the Invention

The field of the invention is data processing, or, more specifically, methods, apparatus, and products for identifying a position of a computing device in a rack.

Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

Modern computing systems may include multiple computing devices grouped together in order to take advantage of economies of scale for electronic infrastructure such as power supplies, networking switches, servers and the like. Such computing devices may be grouped into physical structures known as racks. Current inventory methods for computing devices in racks rely on manual inspection methods or cumbersome and complex electronic inventory systems.

SUMMARY OF THE INVENTION

Methods, computing devices, and products for identifying a position of a computing device in a rack are described in this specification. Such identification of a position of a computing device in a rack may be carried out by: measuring resistance of one or more resistors of a rack position indicator, said rack position indicator affixed to a rack in which said computing device is installed; and ascertaining, from the measured resistance of the one or more resistors, a position in which the computing device is installed.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Exemplary methods, computing devices, and products for identifying a position of a computing device in a rack in accordance with the present invention are described with reference to the accompanying drawings, beginning with FIG. 1. The term 'computing device' refers to any type of device which may be rackmountable. The term 'rack' refers to a frame or enclosure for mounting multiple electronic modules. In some embodiments, such a rack may be a standard 19 inch rack that includes two parallel vertical rails set apparat 19 inches. The rails may include threaded holes for mounting computing devices. The holes in a rail may be run from the top of the rail to the bottom of the rail in predefined spaces. In a standard 19 inch rack, the holes define a number of positions in which computing devices may be mounted. Such positions are often referred to as rack units or slots. A computing device may be a predefined number of rack units in height: 1U, 2U, or 4U, for example. Each rack unit, each position in the rack, may be associated with an identifier such as a number. To inventory computing devices installed a rack, prior art methods include a manual inspection of the rack to associate an identifier of a computing device (serial number, MAC address, or the like) with the identifier of the rack unit or units in which the computing device is installed. Such a manual inspection is inefficient and prone to human error.

Figure 1:
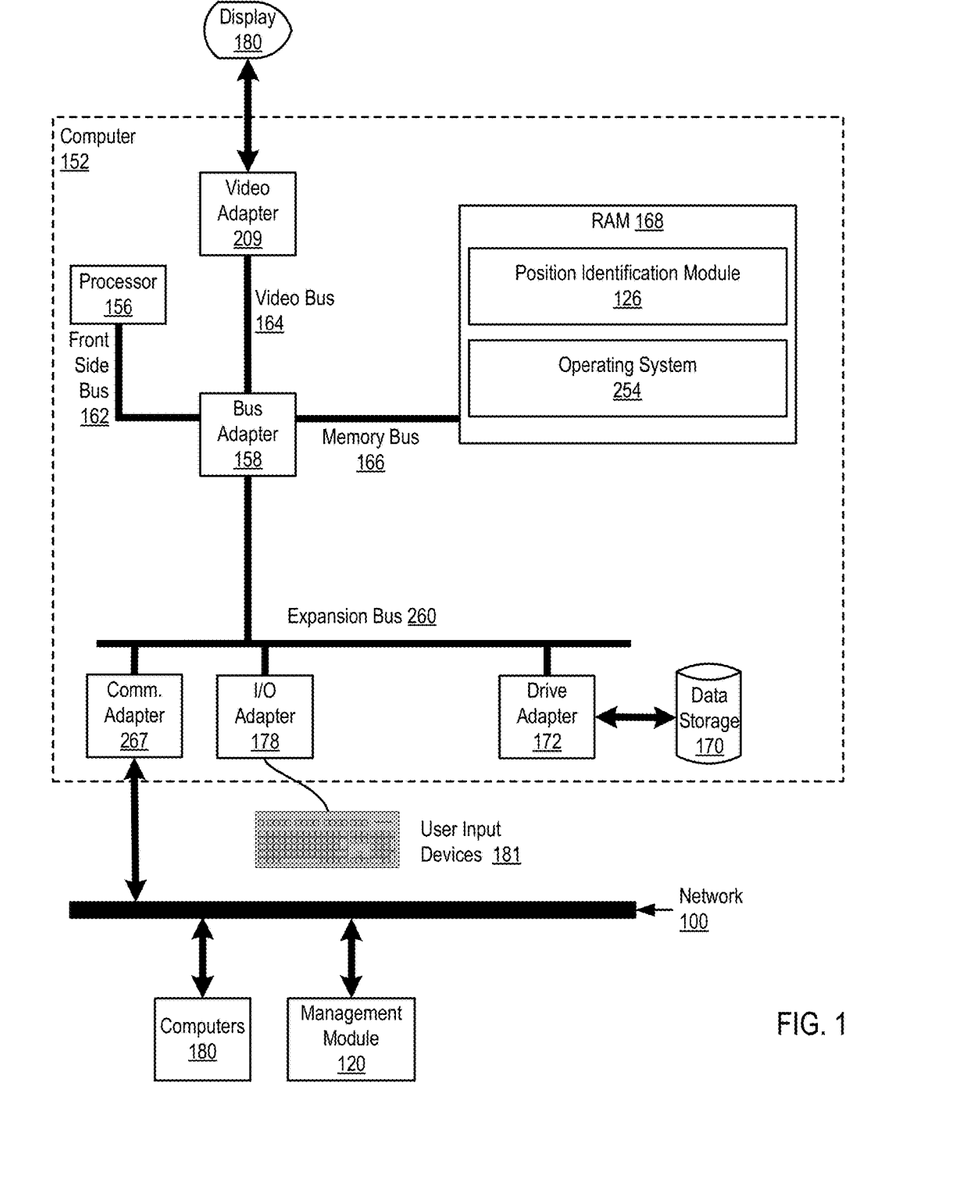
FIG. 1 sets forth a network diagram of a system configured for identifying a position of a computing device in a rack according to embodiments of the present invention.

For further explanation, therefore FIG. 1 sets forth a network diagram of a system configured for identifying a position of a computing device in a rack according to embodiments of the present invention. The system of FIG. 1 includes automated computing machinery in the form of an example computer (152). The computer (152) of FIG. 1 is an example of a computing device which may be installed in a rack. Such a computer (152) may include a server, a switch, a router, a power supply, and the like.

The example computer (152) of FIG. 1 is configured for identifying a position of a computing device in a rack according to embodiments of the present invention. The computer (152) of FIG. 1 includes at least one computer processor (156) or 'CPU' as well as random access memory (168) ('RAM') which is connected through a high speed memory bus (166) and bus adapter (158) to processor (156) and to other components of the computer (152).

Stored in RAM (168) is a position identification module (126), a module of computer program instructions for identifying a position of the computer (152) in the rack in which the computer is installed. Such a position identification module (126) may carry out such an identification by measuring resistance of one or more resistors of a rack position indicator. Such a rack position indicator may be affixed to a rack in which said computing device is installed. The rack position indicator may be implemented in a variety of ways. In some embodiments, for example, the rack position indicator may include two resistors, each of different resistance. One resistor may represent an identifier of the position in the rack, the slot or rack unit, while the other resistor may represent an identifier of the rack itself In such an example embodiment, each position in the rack may include a different rack position indicator. Each indicator may be separately affixed to the rack or many rack position indicators may be included in a strip of rack position indicators. Such a strip may be affixed to a rail of the rack such that each rack position indicator in the strip is affixed to the rack adjacent to the position identified by the resistors of the rack position indicator. For every slot in a rack, for example, a rack position indicator may be affixed to one rail of the rack at the location at which a computing device may be mounted in the slot.

The computing device may include one or more contact pads for contacting the rack position indicator upon mounting the computing device in the rack. The contact pads may, for example, be implemented as conductive material locating on mounting flaps of the computing device. The conductive pads may be wired to circuitry in the computing device that is utilized by the position identification module to measure the resistance of the resistor or resistors in the rack position indicator contacted by the conductive pads upon mounting the computing device. Measuring such resistance may be carried out by applying a predefined voltage to the resistor, measuring the current across the resistor, and calculating the resistance of the resistor.

After measuring the resistance, the position identification module (126) may ascertain, from the measured resistance of the one or more resistors, a position in which the computing device is installed. Ascertaining a position in which the computing device is installed from the measured resistance may be carried out by identifying a position identifier associated with the measured resistance. That is, each different resistance value of the resistors included in the rack position indicators may be associated with a different position identifier. Consider the Table 1 below as an example of rack unit identifiers for a rack with four rack units (or slots).

TABLE 1

| Rack Unit Identifier Table | |
| --- | --- |
| Resistance Value | Rack Unit Identifier |
| 15 ohms | 1 |
| 16 ohms | 2 |
| 17 ohms | 3 |
| 18 ohms | 4 |

As mentioned above, in some embodiments, each rack unit indicator may include a second resistor that represents an identifier of the rack itself. To that end, the position identification module (126), when ascertaining the position of the computing device in the rack with the measured resistance, may also ascertain an identification of the rack in which the computing device is installed with the measured resistance. Ascertaining the identification of the rack may be carried out by identifying a rack identifier associated with the measured resistance of the second resistor. That is, each different resistance value of the resistors included in the rack position indicators may be associated with a different rack identifier. Consider the Table 2 below as an example of rack identifiers for racks within a data center.

TABLE 2

| Rack Identifier Table | |
| --- | --- |
| Resistance Value | Rack Identifier |
| 1k ohms | 1 |
| 2k ohms | 2 |

TABLE 2-continued

| Rack Identifier Table | |
| --- | --- |
| Resistance Value | Rack Identifier |
| 3k ohms | 3 |
| 4k ohms | 4 |

Once the position identification module (126) ascertains position, within a rack, in which the computing device is installed and, in some embodiments, an identification of the rack itself, the position identification module (126) may report the ascertained position to a management module (120). A management module (120) as the term is used in this specification refers to a computing system comprising computer hardware and software that carries out various management tasks in a data center. In some data centers, for example, a management module may monitor and manage health of servers in the data center, may distribute workload among the servers of a data center, may provide user notifications of fault or failover in servers of the data center and so forth as will occur to readers of skill in the art. In some embodiments, the management module (120) may generate a graphical representation of computing devices installed in racks of the data center in dependence upon the ascertained positions of each of the installed computing devices. Such a graphical representation may be useful to a system administrator in instances of a fault, if physical inspection is later needed. In effect, the position identification module (126) enables each computing device in the data center installed in a rack to be self-aware of the computing device's position within the rack and, in some cases, aware of the rack itself. Although each computing device is only aware of its own position, the management module (120) may aggregate the positions of each of the computing devices to form a complete inventory of the computing devices installed in the racks.

Although the position identification module (126) in the example of FIG. 1 is shown as being implemented as a module of computer program instructions stored in RAM (168) and executed by the processor (156), readers of skill in the art will recognize that the position identification module (126) may also be implemented in other ways. For example, computing devices implemented as a server may include a service processor. Such a service processor may be programmed or may execute firmware in the form of the position identification module (126) without the computing device being booted.

Also stored in RAM (168) of the example computer (152) of FIG. 1 is an operating system (154). Operating systems useful in computers configured for identifying a position of a computing device in a rack according to embodiments of the present invention include UNIX™, Linux™, Microsoft WINDOWS™, AIX™, IBM's i5/OS™, and others as will occur to those of skill in the art. The operating system (154) and position identification module (126) in the example of FIG. 1 are shown in RAM (168), but many components of such software typically are stored in non-volatile memory also, such as, for example, on a disk drive (170).

The computer (152) of FIG. 1 includes disk drive adapter (172) coupled through expansion bus (160) and bus adapter (158) to processor (156) and other components of the computer (152). Disk drive adapter (172) connects non-volatile data storage to the computer (152) in the form of disk drive (170). Disk drive adapters useful in computers configured for identifying a position of a computing device in a rack according to embodiments of the present invention include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computer (152) of FIG. 1 includes one or more input/output ('I/O') adapters (178). I/O adapters implement user-oriented input/output through, for example, software drivers and computer hardware for controlling output to display devices such as computer display screens, as well as user input from user input devices (181) such as keyboards and mice. The example computer (152) of FIG. 1 includes a video adapter (209), which is an example of an I/O adapter specially designed for graphic output to a display device (180) such as a display screen or computer monitor. Video adapter (209) is connected to processor (156) through a high speed video bus (164), bus adapter (158), and the front side bus (162), which is also a high speed bus.

The exemplary computer (152) of FIG. 1 includes a communications adapter (167) for data communications with other computers (182) and for data communications with a data communications network (100). Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful in computers configured for identifying a position of a computing device in a rack according to embodiments of the present invention include modems for wired dial-up communications, Ethernet (IEEE 802.3) adapters for wired data communications, and 802.11 adapters for wireless data communications.

The arrangement of computers and other devices making up the exemplary system illustrated in FIG. 1 are for explanation, not for limitation. Data processing systems useful according to various embodiments of the present invention may include additional servers, routers, other devices, and peer-to-peer architectures, not shown in FIG. 1, as will occur to those of skill in the art. Networks in such data processing systems may support many data communications protocols, including for example TCP (Transmission Control Protocol), IP (Internet Protocol), HTTP (HyperText Transfer Protocol), WAP (Wireless Access Protocol), HDTP (Handheld Device Transport Protocol), and others as will occur to those of skill in the art. Various embodiments of the present invention may be implemented on a variety of hardware platforms in addition to those illustrated in FIG. 1.

Figure 2:
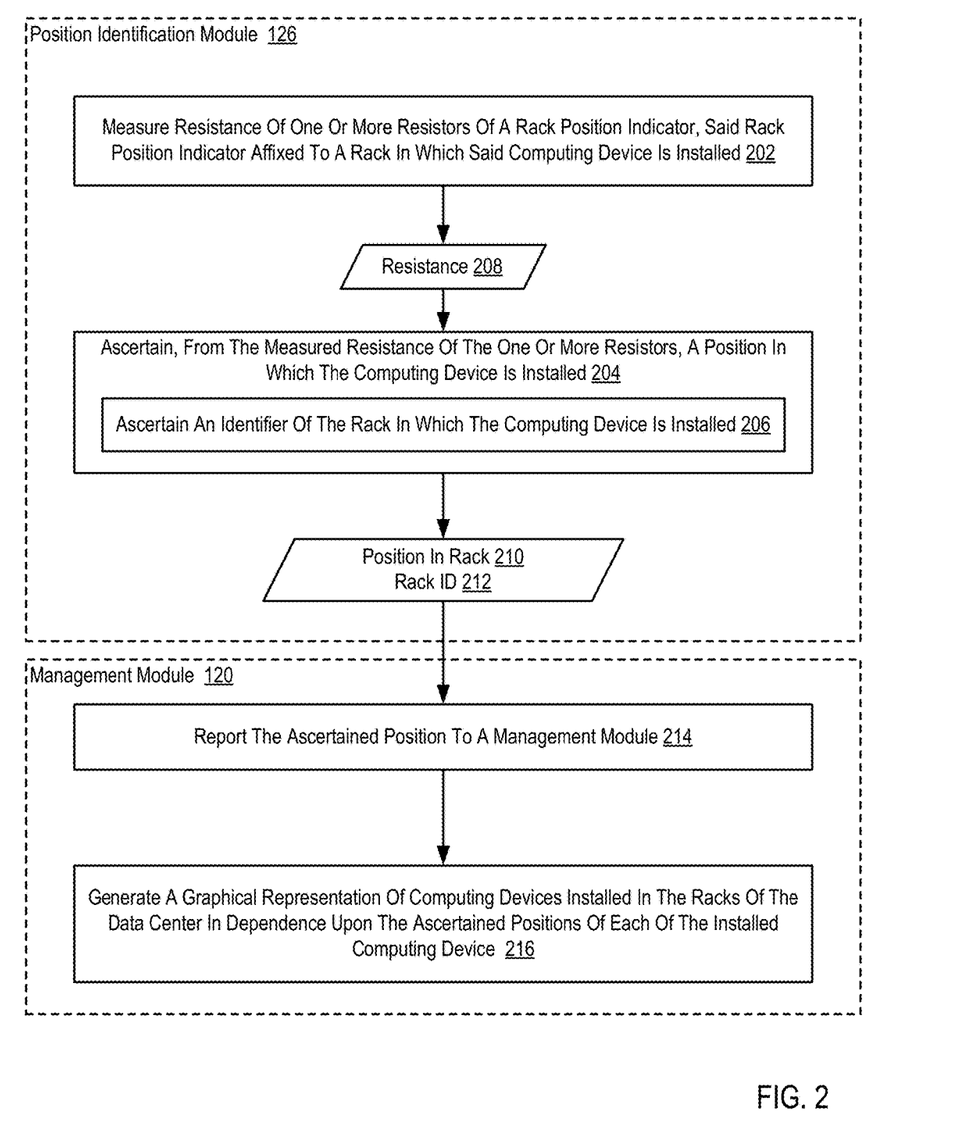
FIG. 2 sets forth a flow chart illustrating an exemplary method for identifying a position of a computing device in a rack according to embodiments of the present invention.

For further explanation, FIG. 2 sets forth a flow chart illustrating an exemplary method for identifying a position of a computing device in a rack according to embodiments of the present invention. The method of FIG. 2 includes measuring (202) resistance (208) of one or more resistors of a rack position indicator, said rack position indicator affixed to a rack in which said computing device is installed. Measuring (202) resistance of one or more resistors may be carried out by applying a voltage to the resistors and measuring the current through resistor. Then, utilizing Ohm's law, the resistance may be calculated.

The method of FIG. 2 also includes ascertaining (204), from the measured resistance of the one or more resistors, a position in which the computing device is installed. Ascertaining (204), from the measured resistance of the one or more resistors, a position in which the computing device is installed may be carried out in a variety of ways including, for example, looking up in a lookup table, the measured resistance (208) to locate in the lookup table, a rack position (210) associated with the measured resistance.

In the method of FIG. 2, ascertaining (204), from the measured resistance (208) of the one or more resistors, a position (210) in which the computing device is installed may also include ascertaining (206) an identifier (212) of the rack in which the computing device is installed. As above, ascertaining (206) an identifier (212) of the rack in which the computing device is installed may be carried out by looking up in a lookup table, the measured resistance (208) to locate in the lookup table, an identifier of a rack (212) associated with the measured resistance (208).

In some embodiments, the rack in which the computing device is installed is one of a plurality of racks in a data center. In such an embodiment, the method of FIG. 2 may continue by reporting (214) the ascertained position to a management module (120). The management module (120) may be configured to generate (216) a graphical representation of computing devices installed in the racks of the data center in dependence upon the ascertained positions of each of the installed computing devices.

Figure 3:
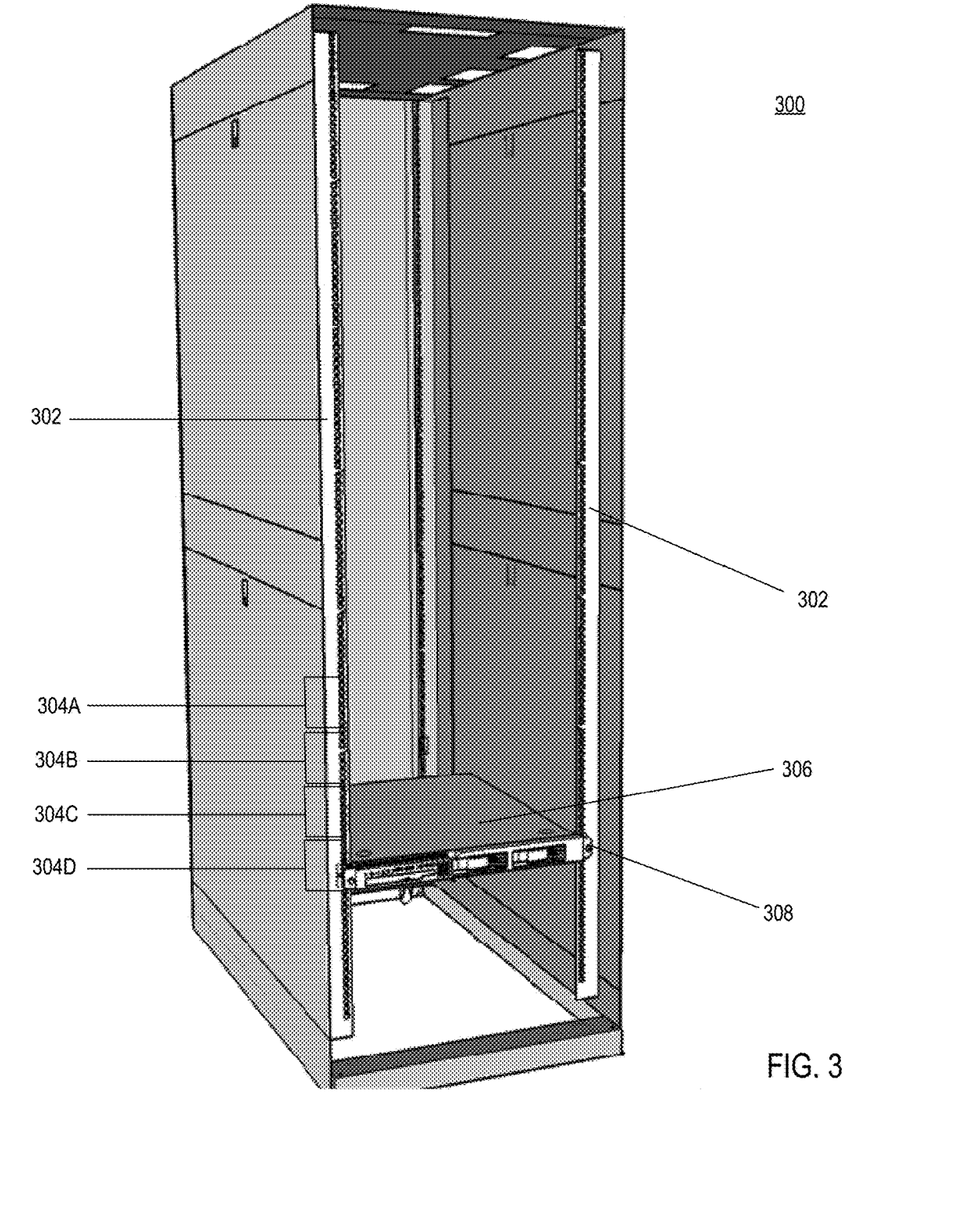
FIG. 3 illustrates an example device rack.

FIG. 3 illustrates an example device rack (300). The example device rack (300) includes rails (302), and various slots or positions (304A, 304B, 304C, 304D), an example computing device (306) installed in one or more of the positions in the rack, and a mounting flap (308).

The example device rack (300) may be a standardized nineteen-inch device rack. That is, the distance between the rails (302) may be nineteen inches. However, other configurations would be available without departing from the scope of the present disclosure. Each rail (302) has a plurality of mounting openings. Such openings may be round, square, rectangular, or other shapes. A group of mounting openings may, for the purposes of this disclosure, be referred to as a "position," "location," or "slot" (304) within the example device rack (300). In a standardized device rack (300), a position may be a standardized size. For example, a "rack unit" typically defines a region that is 1.75 inches high, encompassing three horizontal pairs of mounting openings. An electronic device may take up one or more rack units. For the purposes of this disclosure, the location or position of an electronic device may refer to one, some, or all of the location regions within the device rack (300) taken up by the electronic device. As described in more detail below and with reference to FIG. 4-7, generally only one location (such the top location) may be identified by the position identification module (226) of a computing device installed in the rack (300). An inventory management system may utilize other data known about the computing device such as the computing device's size to determine how much of the physical space of the device rack (300) is taken up by the particular electronic device.

In the example device rack (300), four example positions (304A, 304B, 304C, 304D) are illustrated. Although the example positions (304A, 304B, 304C, 304D) are illustrated as being of a particular size, the example positions (304A, 304B, 304C, 304D) may be of any size without departing from the scope of the present disclosure. In the example device rack (300), an electronic device (306) is present within one of the example positions (304D).

Figure 4:
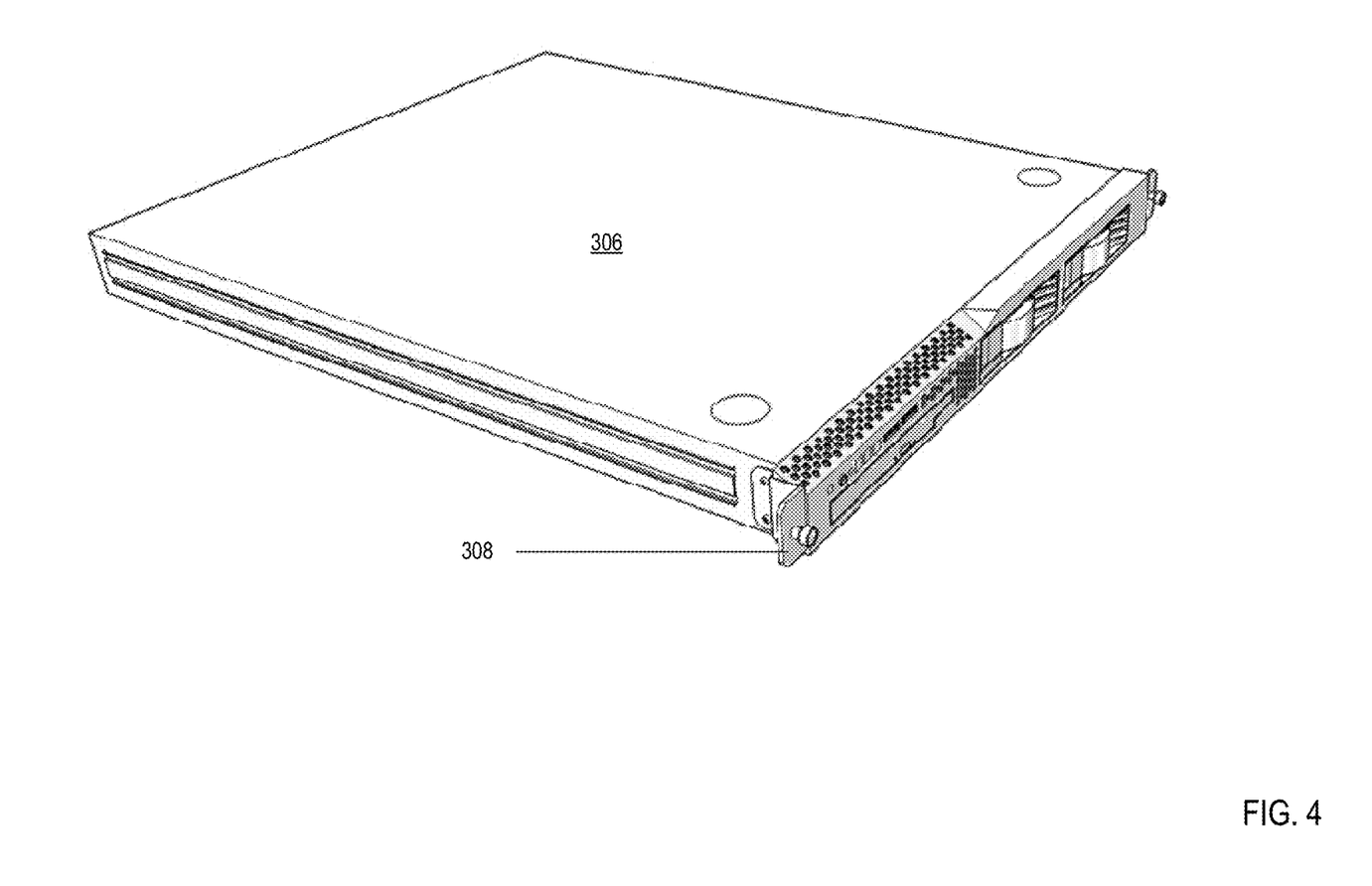
FIG. 4 illustrates an example computing device configured for insertion into an example rack.

FIG. 4 illustrates an example computing device (306) configured for insertion into an example rack (300) such as the example rack set forth in the FIG. 3. The example computing device (306) illustrated is a blade server that is one rack unit in height. However, other types of devices such as power supplies, networking switches, and the like as well as devices of other sizes may be implemented without departing from the scope of the present disclosure. In some embodiments, the example computing device (306) includes mounting flaps (308). In the illustrated computing device (306), the example mounting flap (308) is coupled to the example computing device (306). This coupling may be part of the example computing device (306) as manufactured or may be added after manufacture for the purpose of installing the computing device (306) in the example device rack (300).

Figure 5:
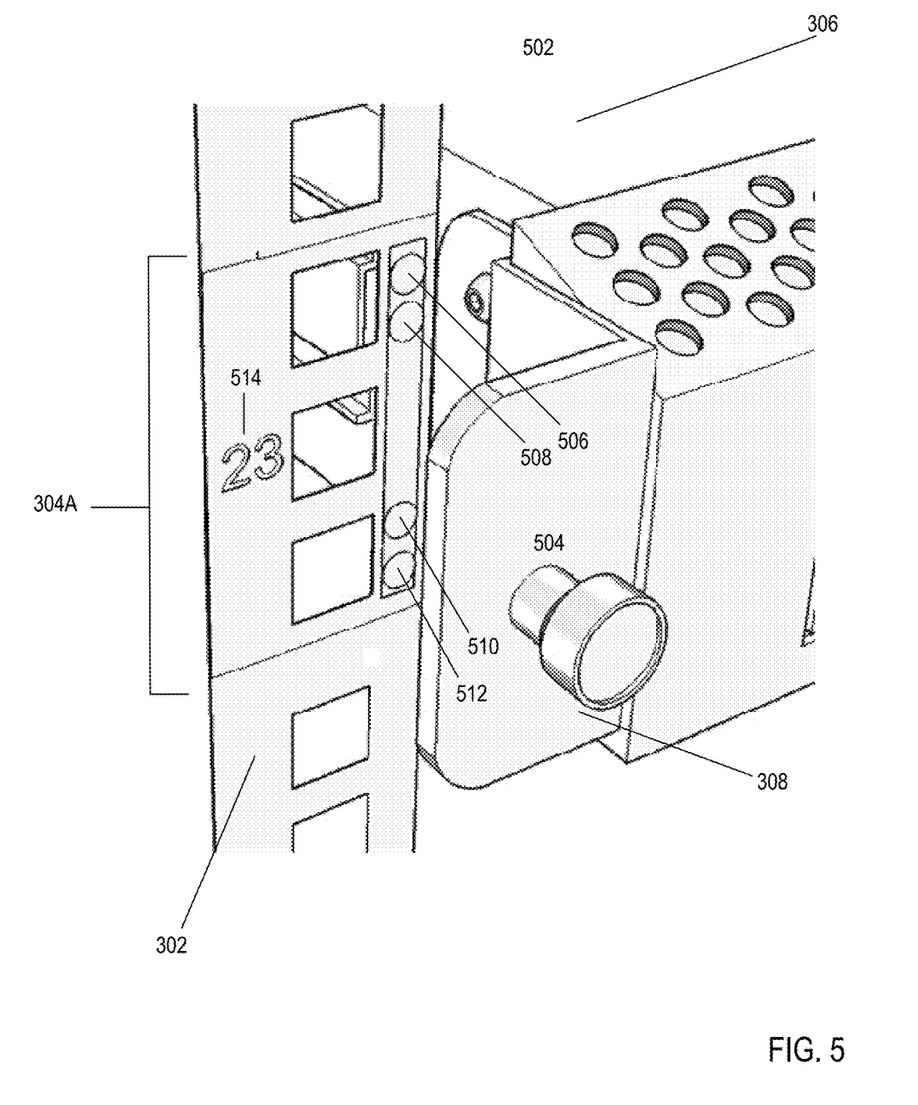
FIG. 5 illustrates an example computing device (306) in the process of installation in a device rack.

FIG. 5 illustrates an example computing device (306) in the process of installation in a device rack. In the example of FIG. 5, a computing device (306) is being installed at location '23' at a height of 1U. The position (304A) includes a visual identifier (514).

The example computing device (306) includes mounting flaps (308) which will make contact with the rail (304) upon full insertion of the computing device. Installed on the rail (302) is a rack position indicator that includes position indicator contact pads (506, 508) and rack indicator contact pads (510, 512). The position indicator contact pads (506, 508) may be conductive material configured to couple to contact pads of the computing device (306) positioned on the interior (not shown in this Figure) of the mounting flap (308)—the portion of the mounting flap facing and parallel to the rail upon installation. A resistor may be coupled between the two position indicator contact pads (506, 508). Upon installation, the computing device's contact pads may make contact with the position indicator contact pads and measure the resistance of the resistor coupled between the position indicator contacts pads.

In a similar manner, another resistor may be coupled between the rack indicator contact pads (510, 512). The computing device may also include on the interior of the mounting flap a second set of contact pads (also formed of conductive material) that couple to the rack indicator contact pads upon installation of computing device in the rack. After the computing device's contact pads make contact with the rack indicator contact pads (510, 512), the computing device may measure the resistance of the resistor coupled between the rack indicator contact pads (510, 512). The computing device may lookup each of the resistances in one or more lookup tables to determine a position of the computing device within the rack and an identifier of the rack itself.

Figure 6:
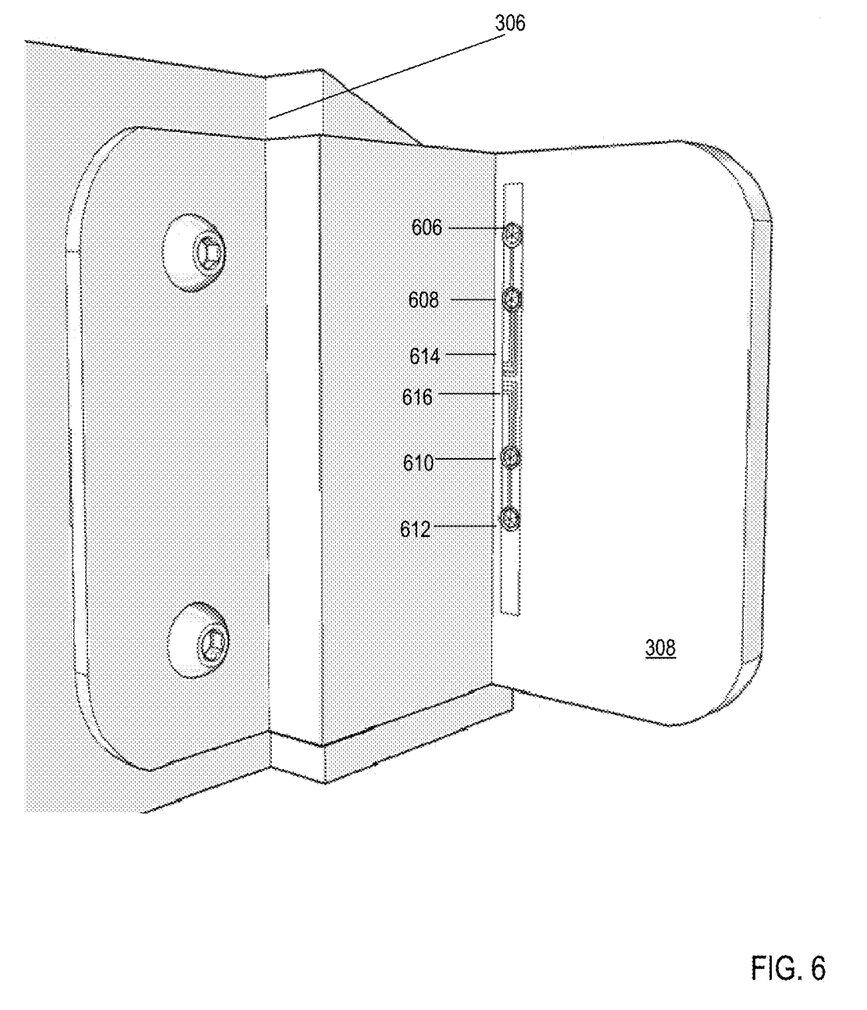
FIG. 6 illustrates an example mounting flap coupled to an example electronic device.

For further explanation, FIG. 6 illustrates an example mounting flap (308) coupled to an example electronic device (306). The mounting flap (308) includes first set of conductive contact pads (606, 608). The first set of conductive contact pads may be configured to make conductive contact with the rack position indicator contact pads on a rail of a rack such as those set forth in FIG. 5 upon installation of the computing device (306) into the rack.

The mounting flap (308) also includes a second set of conductive contact pads (610, 612). The second set of conductive contact pads (610, 612) may be configured to make conductive contact with the rack indicator contact pads on a rail of a rack such as those set forth in FIG. 5 upon installation of the computing device (306) into the rack.

The contact pads may be coupled to circuitry (a CPU, a service processor, Field Programmable Gate Array ('FPGA'), Application Specific Integrated Circuit ('ASIC') and the like) within the computing device through various traces (614, 616). The contact pads may be implemented as conductive material on a flexible printed circuit board, or in other ways as will occur to readers of skill in the art.

Figure 7:
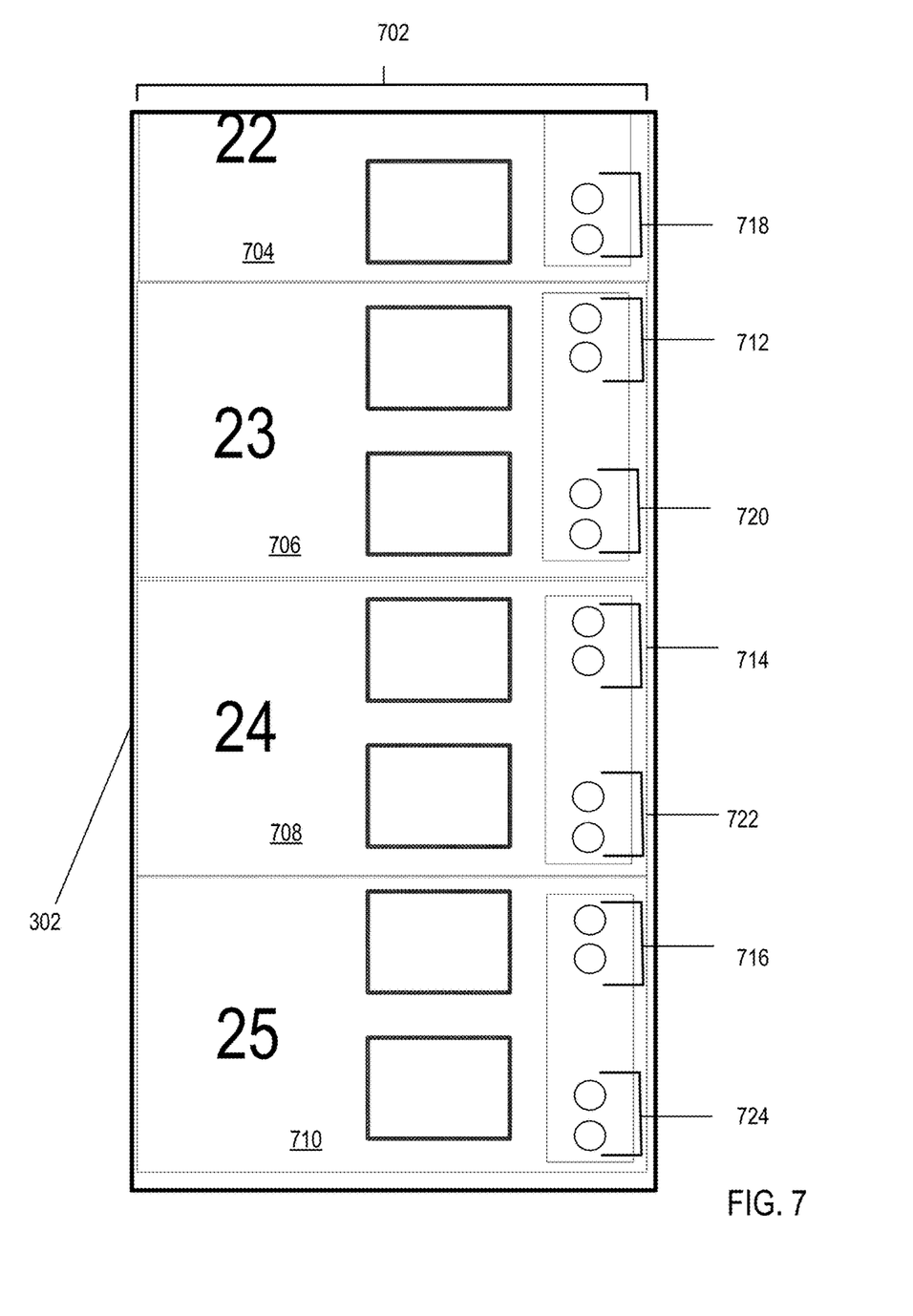
FIG. 7 illustrates an example identifier strip for use in various embodiments.

For further explanation, FIG. 7 illustrates an example identifier strip (702) for use in various embodiments. The identifier strip (702) of FIG. 7 includes a plurality of rack position indicators (704, 706, 708, 710). Each position indicator on the strip (702) identifies and is located adjacent to a position of the rack in which a computing device may be installed. Such identification may be implemented in a variety of ways. In the example of FIG. 7, each of the rack position indicators includes a visual identifier (22, 23, 24, and 25) and each rack position indicator includes two sets of contact pads: one set of rack position contact pads and one set of rack indicator contact pads. A resistor may be coupled between each set of contact pads. The resistance of each resistor may represent a position within the rack or the rack identification itself.

The strip (702) may be flexible, and prior to use, may be stored in a roll, such as a role of tape. The strip may be affixed to at least one rail in the rack. Affixing a strip of position indicators to a rail of a rack may be carried out in various means. A strip may be affixed through adhesive, through magnetism, or in other ways as will be readily apparent to readers of skill in the art. In some embodiments, each position indicator may be separably coupled to one another through perforation or the like.

The strip (702) may also provide a mechanical impact resistance to devices being installed (or re-installed) in the rack. Many devices installed a rack may be heavy and physical mechanical impact resistance may be useful to users installing such heavy devices in the rack.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method comprising:
   by first program instructions executing on a computing device:
   measuring resistance of one or more resistors of a rack position indicator, said rack position indicator affixed to a rack in which said computing device is installed, wherein measuring the resistance of the one or more resistors of the rack position indicator comprises measuring a resistance between a set of conductive contact pads on the computing device, at least one of the set of conductive contact pads on the computing device making conductive contact with contact pads on the rack position indicator affixed to the rack;
   ascertaining, from the measured resistance of the one or more resistors, a position in which the computing device is installed, wherein ascertaining, from the measured resistance of the one or more resistors, the position in which the computing device is installed comprises looking up, in a lookup table, the position associated with the measured resistance, wherein the computing device is self-aware of the position of the computing device; and
   reporting the ascertained position to a management module, wherein the rack is one of a plurality of racks in a data center and wherein the management module is configured to generate a graphical representation of computing devices installed in the racks of the data center in dependence upon the ascertained positions of each of the installed computing devices.

2. The method of claim 1 wherein ascertaining, from the measured resistance of the one or more resistors, a position in which the computing device is installed further comprises ascertaining an identifier of the rack in which the computing device is installed.

3. The method of claim 1 wherein:
the rack position indicator comprises one of a plurality of rack position indicators in an indicator strip;
the indicator strip is affixed to at least one rail of the rack;
each indicator on the strip identifies and is located adjacent to a position of the rack in which a computing device may be installed; and
the computing device includes a mounting flap configured to mount the computing device to the rail of the rack, the mounting flap further comprising the conductive contact pads configured to make contact with an indicator of the indicator strip upon mounting to the rail.

4. The method of claim 3 wherein:
the indicator strip is affixed to the at least one rail of the rack with adhesive.

5. The method of claim 3 wherein:
the indicator strip comprises a flexible material capable of being manipulated into a roll.

6. A computing device comprising a computer processor and a computer memory operatively coupled to the computer processor, the computer memory having disposed within it computer program instructions that, when executed by the computer processor, cause the computing device to carry out the steps of:
measuring resistance of one or more resistors of a rack position indicator, said rack position indicator affixed to a rack in which said computing device is installed, wherein measuring the resistance of the one or more resistors of the rack position indicator comprises measuring a resistance between a set of conductive contact pads on the computing device, at least one of the set of conductive contact pads on the computing device making conductive contact with contact pads on the rack position indicator affixed to the rack;
ascertaining, from the measured resistance of the one or more resistors, a position in which the computing device is installed, wherein ascertaining, from the measured resistance of the one or more resistors, the position in which the computing device is installed comprises looking up, in a lookup table, the position associated with the measured resistance, wherein the computing device is self-aware of the position of the computing device; and
reporting the ascertained position to a management module, wherein the rack is one of a plurality of racks in a data center and wherein the management module is configured to generate a graphical representation of computing devices installed in the racks of the data center in dependence upon the ascertained positions of each of the installed computing devices.

7. The computing device of claim 6 wherein ascertaining, from the measured resistance of the one or more resistors, a position in which the computing device is installed further comprises ascertaining an identifier of the rack in which the computing device is installed.

8. The computing device of claim 6 wherein:
the rack position indicator comprises one of a plurality of rack position indicators in an indicator strip;
the indicator strip is affixed to at least one rail of the rack;
each indicator on the strip identifies and is located adjacent to a position of the rack in which a computing device may be installed; and
the computing device includes a mounting flap configured to mount the computing device to the rail of the rack, the mounting flap further comprising the conductive contact pads configured to make contact with an indicator of the indicator strip upon mounting to the rail.

9. The computing device of claim 8 wherein:
the indicator strip is affixed to the at least one rail of the rack with adhesive.

10. The computing device of claim 8 wherein:
the indicator strip comprises a flexible material capable of being manipulated into a roll.

11. A computer program product comprising a non-transitory computer readable medium, the computer readable medium comprising computer program instructions that, when executed, cause a computing device to carry out the steps of:
measuring resistance of one or more resistors of a rack position indicator, said rack position indicator affixed to a rack in which said computing device is installed, wherein measuring the resistance of the one or more resistors of the rack position indicator comprises measuring a resistance between a set of conductive contact pads on the computing device, at least one of the set of conductive contact pads on the computing device making conductive contact with contact pads on the rack position indicator affixed to the rack;
ascertaining, from the measured resistance of the one or more resistors, a position in which the computing device is installed, wherein ascertaining, from the measured resistance of the one or more resistors, the position in which the computing device is installed comprises looking up, in a lookup table, the position associated with the measured resistance, wherein the computing device is self-aware of the position of the computing device; and
reporting the ascertained position to a management module, wherein the rack is one of a plurality of racks in a data center and wherein the management module is configured to generate a graphical representation of computing devices installed in the racks of the data center in dependence upon the ascertained positions of each of the installed computing devices.

12. The computer program product of claim 11 wherein ascertaining, from the measured resistance of the one or more resistors, a position in which the computing device is installed further comprises ascertaining an identifier of the rack in which the computing device is installed.

13. The computer program product of claim 11 wherein:
the rack position indicator comprises one of a plurality of rack position indicators in an indicator strip;
the indicator strip is affixed to at least one rail of the rack;
each indicator on the strip identifies and is located adjacent to a position of the rack in which a computing device may be installed; and
the computing device includes a mounting flap configured to mount the computing device to the rail of the rack, the mounting flap further comprising the conductive contact pads configured to make contact with an indicator of the indicator strip upon mounting to the rail.

14. The computer program product of claim 13 wherein:
the indicator strip is affixed to the at least one rail of the rack with adhesive.

15. The computer program product of claim 13 wherein:
the indicator strip comprises a flexible material capable of being manipulated into a roll.

16. The computer program product of claim 11 wherein the computer readable medium comprises a storage medium.

* * * * *